(12) United States Patent
Whetsel et al.

(10) Patent No.: US 7,389,456 B2
(45) Date of Patent: Jun. 17, 2008

(54) IC WITH LINKING MODULE IN SERIES WITH TAP CIRCUITRY

(75) Inventors: Lee D. Whetsel, Parker, TX (US);
Baher S. Haroun, Allen, TX (US);
Brian J. Lasher, Bellaire, TX (US);
Anjali Kinra, Stafford, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/279,503

(22) Filed: Apr. 12, 2006

(65) Prior Publication Data

US 2006/0242500 A1 Oct. 26, 2006

Related U.S. Application Data

(62) Division of application No. 09/864,509, filed on May 24, 2001, now Pat. No. 7,058,862.

(60) Provisional application No. 60/207,691, filed on May 26, 2000.

(51) Int. Cl.
*G01R 31/28* (2006.01)

(52) U.S. Cl. .................. 714/727; 714/729

(58) Field of Classification Search .............. None
See application file for complete search history.

(56) References Cited

U.S. PATENT DOCUMENTS 5,606,566 A * 2/1997 Whetsel ............... 714/729

6,587,981 B1 * 7/2003 Muradali et al. ........... 714/726
6,658,614 B1 * 12/2003 Nagoya .................... 714/727
7,058,862 B2 * 6/2006 Whetsel et al. ............ 714/724

OTHER PUBLICATIONS

IEEE Standard Test Access Port and Boundary-Scan Architecture, IEEE Computer Society, Oct. 21, 1993.*
"Hierarchical Test Access Architecture for Embedded Cores in an Integrated Circuit" by Bhattacharya, D. VLSI Test Symposium Proceedings, Publication Date: Apr. 26-30, 1998 pp. 8-14 Inspec Accession No. 6039765.*

* cited by examiner

*Primary Examiner*—Cynthia Britt
(74) *Attorney, Agent, or Firm*—Lawrence J. Bassuk; W. James Brady; Frederick J. Telecky, Jr.

(57) ABSTRACT

IEEE 1149.1 Test Access Ports (TAPs) may be utilized at both IC and intellectual property core design levels. TAPs serve as serial communication ports for accessing a variety of embedded circuitry within ICs and cores including; IEEE 1149.1 boundary scan circuitry, built in test circuitry, internal scan circuitry, IEEE 1149.4 mixed signal test circuitry, IEEE P5001 in-circuit emulation circuitry, and IEEE P1532 in-system programming circuitry. Selectable access to TAPs within ICs is desirable since in many instances being able to access only the desired TAP(s) leads to improvements in the way testing, emulation, and programming may be performed within an IC. A TAP linking module is described that allows TAPs embedded within an IC to be selectively accessed using 1149.1 instruction scan operations.

8 Claims, 5 Drawing Sheets

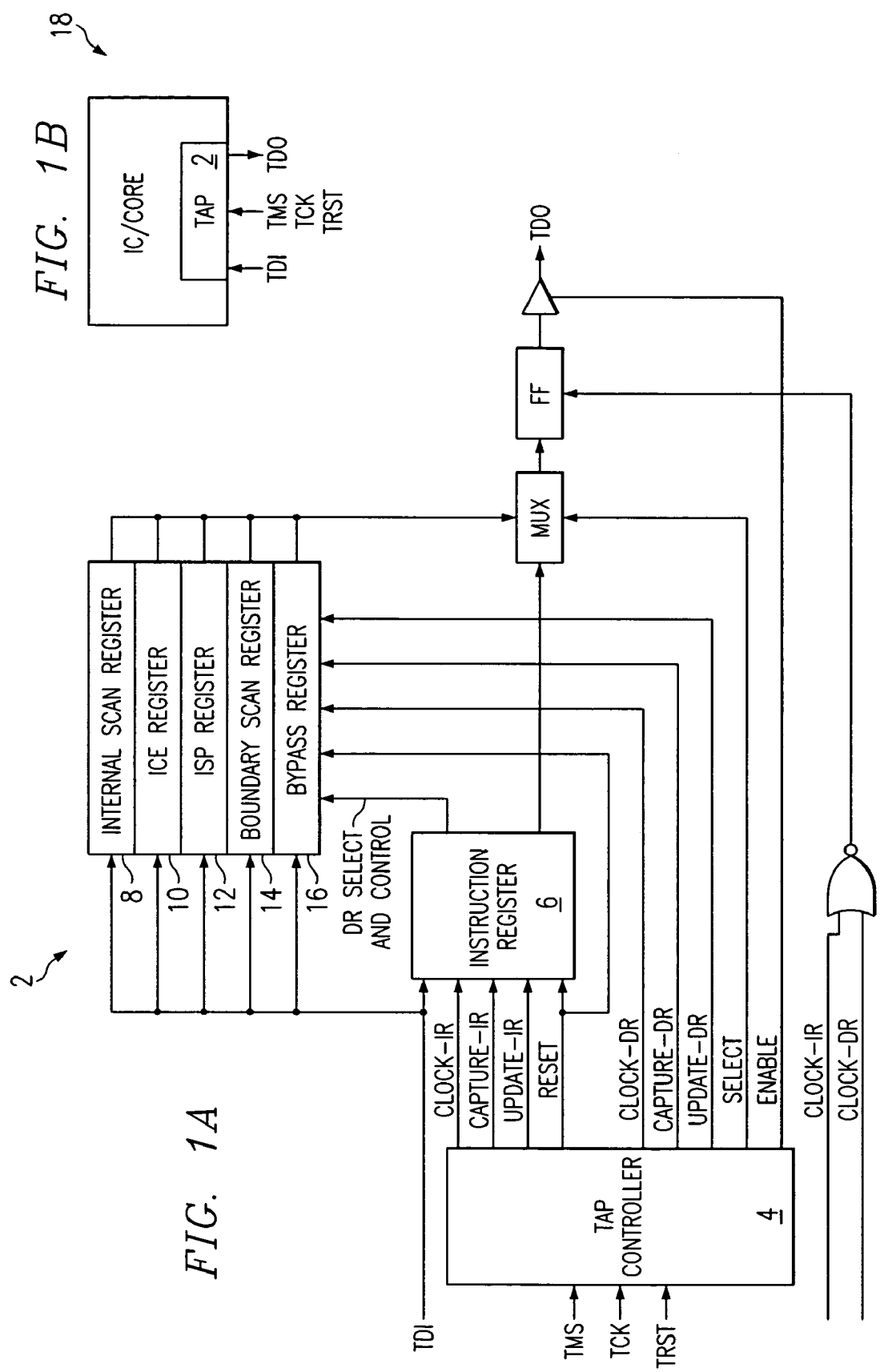

IC WITH LINKING MODULE IN SERIES WITH TAP CIRCUITRY

This application is a divisional of application Ser. No. 09/864,509, filed May 24, 2001, now U.S. Pat. No. 7,058,862;
which claims priority under 35 USC 119(e)(1) of provisional application Ser. No. 60/207,691, filed May 26, 2000.

CROSS REFERENCE TO RELATED APPLICATIONS

This application is related to 1) application Ser. No. 08/918,872, filed Aug. 26, 1999, now U.S. Pat. No. 6,073,254, "Selectively Accessing Test Access Ports in a Multiple Test Access Port Environment", which is hereby incorporated by reference, 2) application Ser. No. 09/458,313, filed Dec. 10, 1999, now U.S. Pat. No. 6,324,614, "Selectively Accessing Test Access Ports in a Multiple Test Access Port Environment", which is hereby incorporated by reference, and 3) application Ser. No. 09/277,504, filed Mar. 26, 1999, now U.S. Pat. No. 6,324,662, "A TAP and Linking Module for Scan Access of Multiple Cores with 1149.1 Test Access Ports", which is hereby incorporated by reference.

FIELD OF THE INVENTION

The present invention relates generally to integrated circuits and, more particularly, to test interfaces for integrated circuits and/or cores.

BACKGROUND OF THE INVENTION

FIG. 1A illustrates the test architecture of a conventional 1149.1 TAP 2. The TAP 2 includes a TAP controller 4, instruction register 6, set of data register including; (1) an internal scan register 8, (2) an in-circuit emulation (ICE) register 10, (3) an in-system programming (ISP) register 12, (4) a boundary scan register 14, and (5) a bypass register 16. Of the data registers, the boundary scan register 14 and bypass register 16 are defined by the IEEE 1149.1 standard. The other shown data registers are not defined by 1149.1, but can exist as data registers within the 1149.1 architecture. The TAP controller 4 responds to the TCK and TMS inputs to coordinate serial communication through either the instruction register 6 from TDI to TDO, or through a selected one of the data registers from TDI to TDO. The TRST input is used to initialize the TAP 2 to a known state. The operation of the TAP 2 is well known.

FIG. 1B illustrates an IC or intellectual property core circuit 18 incorporating the TAP 2 and its TDI, TDO, TMS, TCK, and TRST interface. A core circuit is a complete circuit function that is embedded within an IC, such as a DSP or CPU. FIGS. 1C-1F illustrate the association between each of the data registers of FIG. 1A and the target circuit they connect to and access.

FIG. 2 illustrates the state diagram of the TAP controller 4 of FIG. 1A. The TAP controller is clocked by the TCK input and transitions through the states of FIG. 2 in response to the TMS input. As seen in FIG. 2, the TAP controller state diagram consists of four key state operations, (1) a Reset/Run Test Idle state operation where the TAP controller goes to either enter a reset state, a run test state, or an idle state, (2) a Data or Instruction Scan Select state operation the TAP controller may transition through to select a data register (DR) or instruction register (IR) scan operation, or return to the reset state, (3) a Data Register Scan Protocol state operation where the TAP controller goes when it communicates to a selected data register, and (4) an Instruction Register Scan Protocol state operation where the TAP controller goes when it communicates to the instruction register. The operation of the TAP controller is well known.

FIG. 3 illustrates an example arrangement for connecting multiple TAP domains within an IC 20. The FIG. 3 example and other TAP domain linking arrangement examples are described in application Ser. No. 08/918,872, filed Aug. 26, 1999, now U.S. Pat. No. 6,073,254. Each TAP domain in FIG. 3 is a complete TAP architecture similar to that shown and described in regard to FIG. 1A. While only one IC TAP domain 22 exists in an IC, any number of core TAP domains (1-N) may exist within an IC. As seen in FIG. 3, the IC TAP domain 22 and Core 1-N TAP domains $24_1$-$24_n$, are daisy-chained between the IC's TDI and TDO pins. All TAP domains are connected to the IC's TMS, TCK, and TRST signals and operate according to the state diagram of FIG. 2. During instruction scan operations, instructions are shifted into each TAP domain instruction register. One drawback of the TAP domain arrangement of FIG. 3 is that it does not comply with the IEEE 1149.1 standard, since, according to the rules of that standard, only the ICs TAP domain should be present between TDI and TDO when the IC is initially powered up. A second drawback of the TAP domain arrangement of FIG. 3 is that it may lead to unnecessarily complex access for testing, in-circuit emulation, and/or in-circuit programming functions associated with ones of the individual TAP domains.

For example, if scan testing is required on circuitry associated with the Core 1 TAP domain, each of the scan frames of the test pattern set developed for testing the Core 1 circuitry must be modified from their original form. The modification involves adding leading and trailing bit fields to each scan frame such that the instruction and data registers of the leading and trailing TAP domains become an integral part of the test pattern set of Core 1. Serial patterns developed for in-circuit emulation and/or in-circuit programming of circuitry associated with the TAP domain of Core 1 must be similarly modified. To overcome these and other drawbacks of the TAP arrangement of FIG. 3, the invention as described below is provided.

BRIEF DESCRIPTION OF THE DRAWINGS

FIG. 1A illustrates the test architecture of a conventional 1149.1 TAP.

FIG. 1B illustrates an IC or intellectual property core circuit incorporating the TAP and its TDI, TDO, TMS, TCK, and TRST interface.

DETAILED DESCRIPTION OF THE INVENTION

Figure 4:
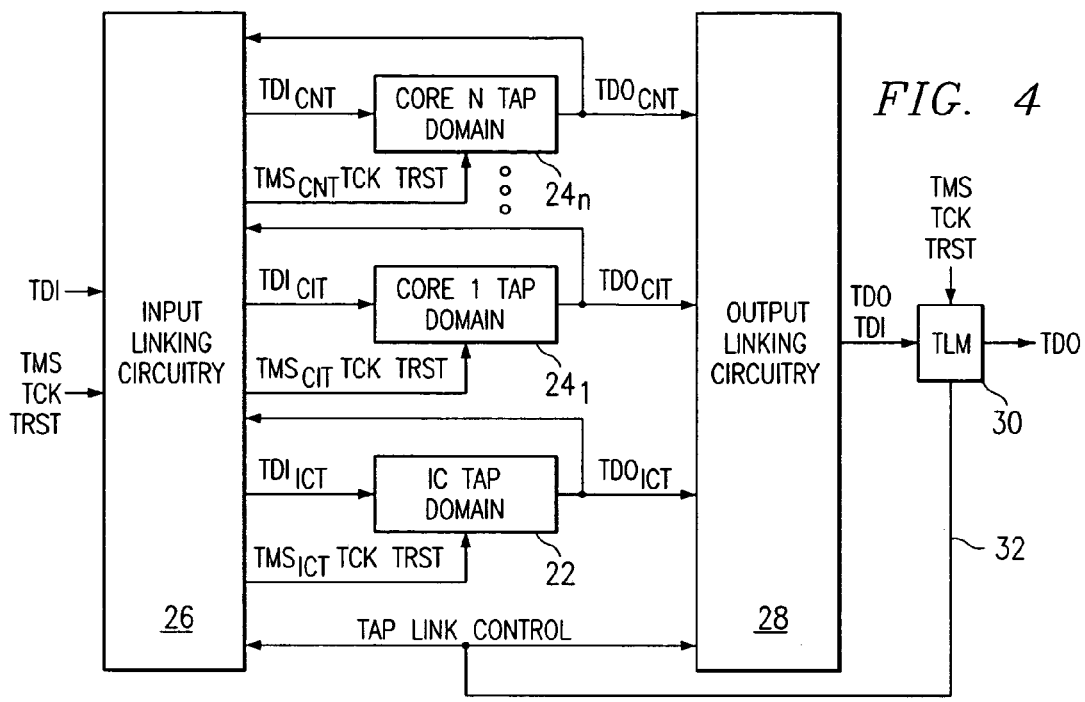
FIG. 4 illustrates a structure for connecting multiple TAP domains within an IC according to the present invention.

FIG. 4 illustrates the preferred structure for connecting multiple TAP domains within an IC according to the present invention. The structure of the present invention includes input linking circuitry 26 and output linking circuitry 28 for connecting any one or more TAP domains to the ICs TDI, TDO, TMS, TCK and TRST pins, and a TAP Linking Module (TLM) 30 circuit for providing the control to operate the input and output linking circuitry. The concept of input and output linking circuitry and use of a TLM circuit to control the input and output linking circuitry is disclosed in application Ser. No. 08/918,872, filed Aug. 26, 1999, now U.S. Pat. No. 6,073,254.

Figure 5:
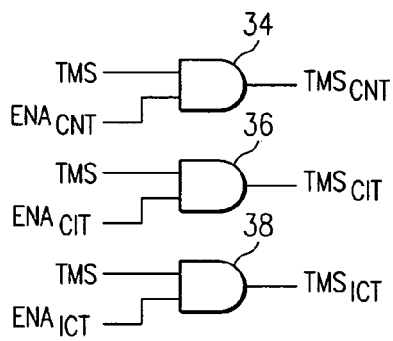
FIG. 5 illustrates circuitry for providing the gated TMSICT, TMSCIT, and TMSCNT signals.

The input linking circuitry 26 receives as input; (1) the TDI, TMS, TCK, and TRST IC pins signals, (2) the TDO outputs from the IC TAP (ICT) domain 22 ($TDO_{ICT}$), the Core 1 TAP (CIT) domain $24_1$ ($TDO_{CIT}$), and the Core N TAP (CNT) domain $24_n$ ($TDO_{CNT}$), and (3) TAP link control input from the TLM 30. The TCK and TRST inputs pass unopposed through the input linking circuitry 26 to be input to each TAP domain. The TMS input to the input linking circuitry 26 is gated within the input linking circuitry such that each TAP domain receives a uniquely gated TMS output signal. As seen in FIG. 4, the IC TAP domain 22 receives a gated $TMS_{ICT}$ signal, the Core 1 TAP domain $24_1$ receives a gated $TMS_{CIT}$ signal, and the Core N TAP domain $24_n$ receives a gated $TMS_{CNT}$ signal. Example circuitry for providing the gated $TMS_{ICT}$, $TMS_{CIT}$, and $TMS_{CNT}$ signals is shown in FIG. 5. In FIG. 5, the $ENA_{ICT}$, $ENA_{CIT}$, and $ENA_{CNT}$ signals used to gate the $TMS_{ICT}$, $TMS_{CIT}$, and $TMS_{CNT}$ signals, respectively, come from the TLM 30 via the TAP link control bus 32.

Figure 2:
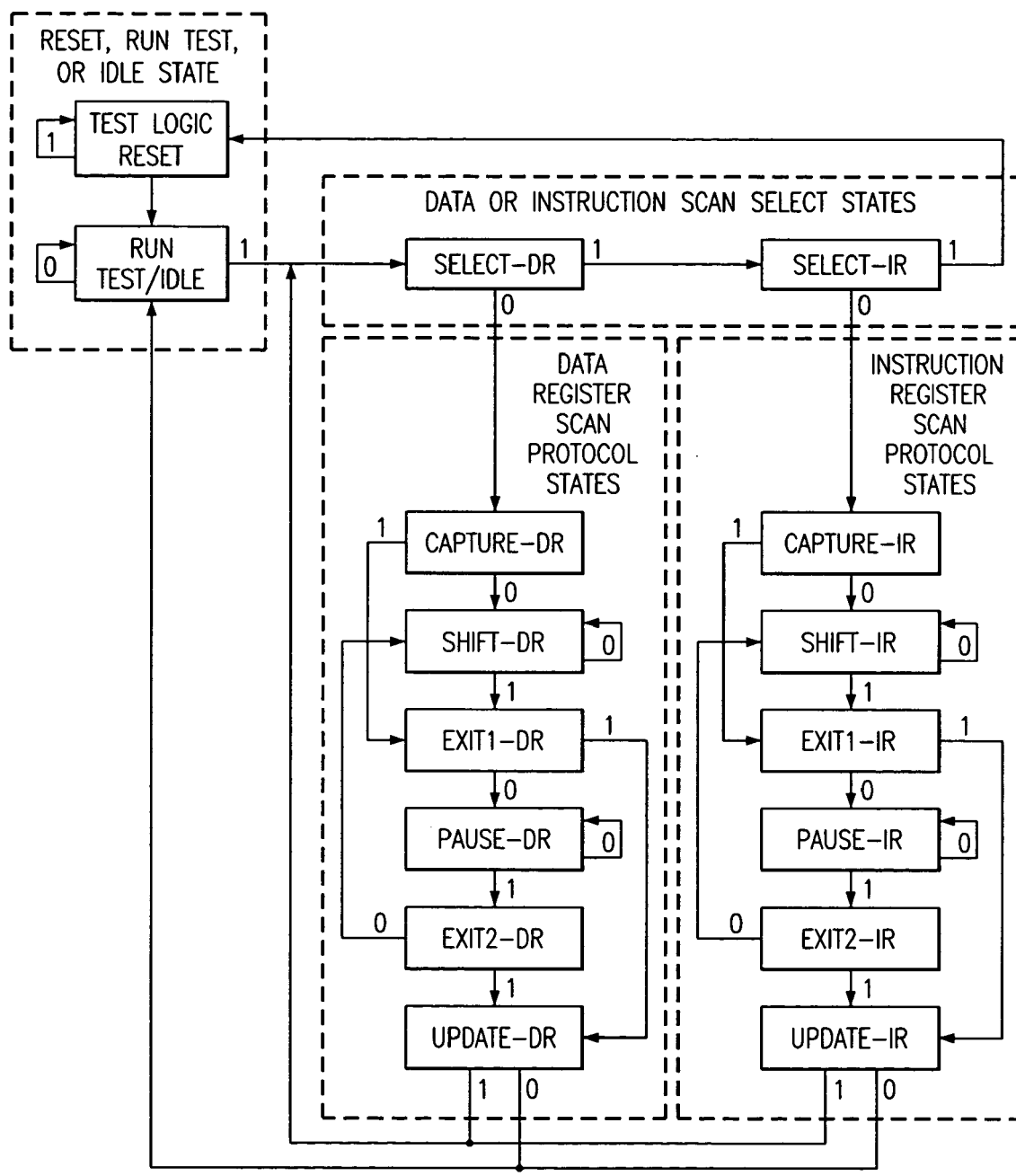
FIG. 2 illustrates the state diagram of the TAP controller of FIG. 1A.

From FIG. 5 it is seen that $TMS_{CNT}$ can be connected by way of AND gate 34 to TMS to enable the Core N TAP domain or be gated low to disable the Core N TAP domain, $TMS_{CIT}$ can be connected by way of AND gate 36 to TMS to enable the Core 1 TAP domain or be gated low to disable the Core 1 TAP domain, and $TMS_{ICT}$ can be connected by way of AND gate 38 to TMS to enable the IC TAP domain or be gated low to disable the IC TAP domain. When a TAP domain TMS input ($TMS_{CNT}$, $TMS_{CIT}$, $TMS_{ICT}$) is gated low, the TAP domain is disabled by forcing it to enter the Run Test/Idle state of FIG. 2. A disabled TAP domain will remain in the Run Test/Idle state until it is again enabled by coupling it to the IC's TMS pin input as mentioned above. These methods of enabling TAP domains from the Run Test/Idle state and disabling TAP domains to the Run Test/Idle state are disclosed in application Ser. No. 08/918, 872, filed Aug. 26, 1999, now U.S. Pat. No. 6,073,254.

Figure 6:
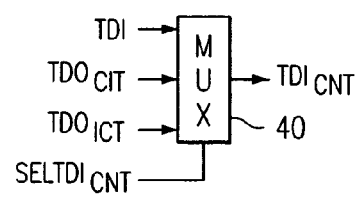
FIG. 6 illustrates circuitry for providing the $TDI_{ICT}$, $TDI_{CIT}$, and $TDI_{CNT}$ input signals.

The TDI, $TDO_{CNT}$, $TDO_{CIT}$, and $TDO_{ICT}$ inputs to the input linking circuitry 26 are multiplexed by circuitry within the input linking circuitry such that each TAP domain receives a uniquely selected TDI input signal. As seen in FIG. 4, the IC TAP domain 22 receives a $TDI_{ICT}$ input signal, the Core 1 TAP domain $24_1$ receives a $TDI_{CIT}$ input signal, and the Core N TAP domain $24_n$ receives a $TDI_{CNT}$ input signal. Example circuitry for providing the $TDI_{ICT}$, $TDI_{CIT}$, and $TDI_{CNT}$ input signals is shown in FIG. 6. In FIG. 6, the $SELTDI_{ICT}$, $SELTDI_{CIT}$, and $SELTDI_{CNT}$ control signals used to select the source of the $TDI_{ICT}$, $TDI_{CIT}$, and $TDI_{CNT}$ input signals, respectively, come from the TLM 30 via the TAP link control bus 32. From FIG. 6 it is seen that $TDI_{CNT}$ can be selectively connected by way of multiplexer 40 to TDI, $TDO_{CIT}$, or $TDO_{ICT}$, $TDI_{CIT}$ can be selectively connected by way of multiplexer 42 to TDI, $TDO_{CNT}$, or $TDO_{ICT}$, and $TDI_{ICT}$ can be selectively connected by way of multiplexer 44 to TDI, $TDO_{CNT}$, or $TDO_{CIT}$.

Figure 7:
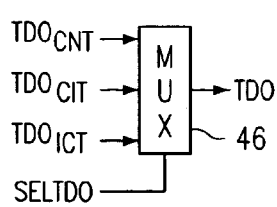
FIG. 7 illustrates circuitry for multiplexing of the $TDO_{ICT}$, $TDO_{CIT}$, and $TDO_{CNT}$ signals to the TDO output.

The output linking circuitry 28 receives as input; (1) the TDOCNT output from the Core N Tap domain $24_n$, the $TDO_{CIT}$ output from the Core 1 TAP domain $24_1$, the $TDO_{ICT}$ output from the IC TAP domain 22, and TAP link control input from the TLM 30. As seen in FIG. 4, the output linking circuitry 28 outputs a selected one of the $TDO_{CNT}$, $TDO_{CIT}$, and $TDO_{ICT}$ input signals to the TLM 30 via the output linking circuitry TDO output. Example circuitry for providing the multiplexing of the $TDO_{ICT}$, $TDO_{CIT}$, and $TDO_{CNT}$ signals to the TDO output is shown in FIG. 7. In FIG. 7, the SELTDO control input used to switch the $TDO_{ICT}$, $TDO_{CIT}$, or $TDO_{CNT}$ signals to TDO come from the TLM 30 via the TAP link control bus 32. From FIG. 7 it is seen that any one of the $TDO_{CNT}$, $TDO_{CIT}$, and $TDO_{ICT}$ signals can be selected as the input source to the TLM 30 by way of multiplexer 46.

The TLM circuit 30 receives as input the TDO output from the output linking circuitry 28 and the TMS, TCK, and TRST IC input pin signals. The TLM circuit 30 outputs to the IC's TDO output pin. From inspection, it is seen that the TLM 30 lies in series with the one or more TAP domains selected by the input and output linking circuitry 26, 28.

As described above, the TLM's TAP link control bus 32 is used to control the input and output connection circuitry to form desired connections to one or more TAP domains so that the one of more TAP domains may be accessed via the IC's TDI, TDO, TMS, TCK and TRST pins. According to the present invention and as will be described in detail below, the TAP link control bus signals are output from the TLM 30 during the Update-IR state of the IEEE TAP controller state diagram of FIG. 2.

Figure 1C:
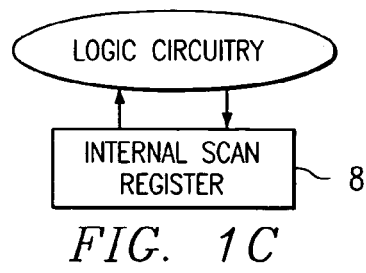
FIGS. 1C-1F illustrate the association between each of the data registers of FIG. 1A and the target circuit they connect to and access.
Figure 1D:
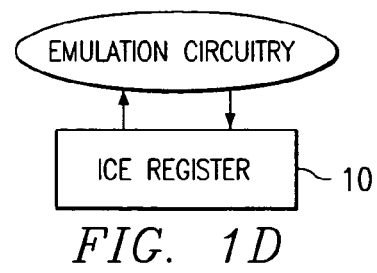
Figure 1E:
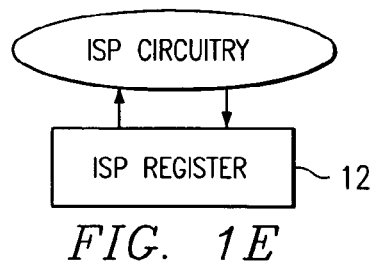
Figure 1F:
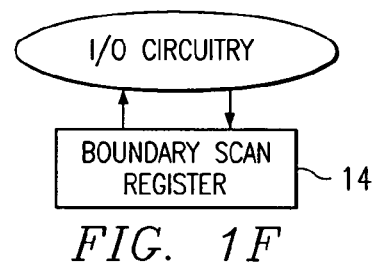
Figure 3:
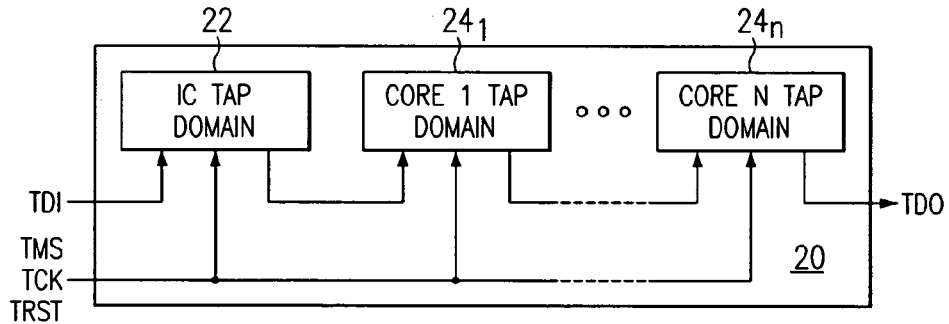
FIG. 3 illustrates an arrangement for connecting multiple TAP domains within an IC.
Figure 8A:
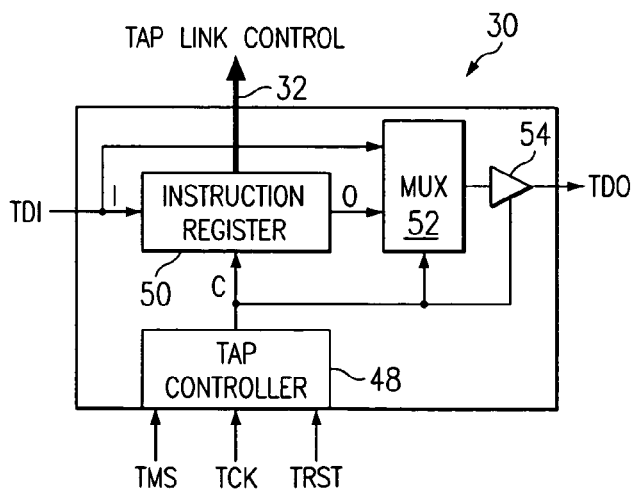
FIG. 8A illustrates the structure of the TLM.

FIG. 8A illustrates in detail the structure of the TLM 30. The TLM 30 consists of a TAP controller 48, instruction register 50, multiplexer 52, and 3-state TDO output buffer 54. The TAP controller 48 is connected to the TMS, TCK and TRST signals. The TDI input is connected to the serial input (I) of the instruction register 50 and to a first input of the multiplexer 52. The serial output (O) of the instruction register 50 is connected to the second input of the multiplexer 52. The parallel output of the instruction register 50 is connected to the TAP link control bus 32 of FIG. 4. The output of the multiplexer 52 is connected to the input of the 3-state buffer 54. The output of the 3-state buffer 54 is connected to the IC TDO output pin. The TAP controller 48 outputs control (C) to the instruction register 50, multiplexer 52, and 3-state TDO output buffer 54. The TAP controller 48 responds to TMS and TCK input as previously described in regard to FIGS. 1A and 2. During instruction scan operations, the TAP controller 48 enables the 3-state TDO buffer 54 and shifts data through the instruction register 50 from TDI to TDO. During data scan operations, the TAP controller 48 enables the 3-state TDO buffer 54 and forms a connection, via the multiplexer 52, between TDI and TDO.

Figure 8B:
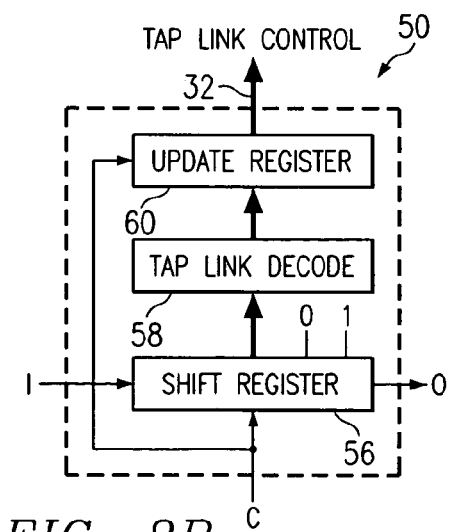
FIG. 8B illustrates the structure of the instruction register.

FIG. 8B illustrates the instruction register 50 in more detail. The instruction register 50 consists of a shift register 56, TAP link decode logic 58, and update register 60. The shift register 56 has a serial input (I), a serial output (O), a control (C) inputs, a parallel output, and a parallel input. The parallel input is provided for capturing fixed logic 0 and 1 data bits into the first two bit positions shifted out on TDO during instruction scan operations, which is a requirement of the IEEE 1149.1 standard. The parallel output from the instruction register is input to TAP link decode logic 58. The parallel output from the TAP link decode logic 58 is input to the update register 60. The parallel output of the update register 60 is the TAP link control bus input to the input and output linking circuitry. During the Capture-IR state of FIG. 2, the shift register 56 captures data (0 & 1) on the parallel input, During the Shift-IR state of FIG. 2, the shift register 56 shifts data from TDI (I) to TDO (O). During the Update-IR state of FIG. 2, the update register 60 loads the parallel input from the TAP link decode logic 58 and outputs the loaded data onto the TAP link control bus 32.

Figure 9:
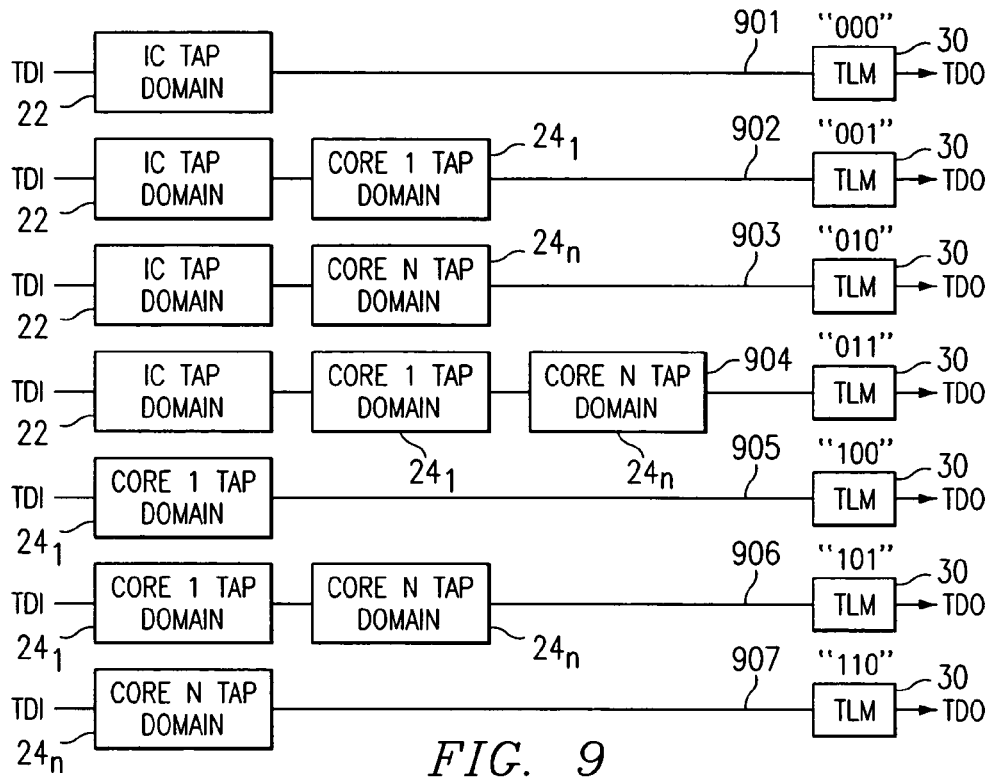
FIG. 9 illustrates various arrangements of TAP domain connections during 1149.1 instruction scan operations using the present invention.

FIG. 9 illustrates various possible arrangements 901-907 of TAP domain connections during 1149.1 instruction scan operations using the present invention. Since during instruction scan operations, the TLM's instruction register is physically present and in series with the connected TAP domain(s) instruction register(s), the instruction scan frame for each arrangement will be augmented to include the TLM's instruction register bits. The concept of augmenting the length of TAP domain instruction registers with a TLM's instruction register is disclosed in pending patent application Ser. No. 09/277,504, filed Mar. 26, 1999. It is assumed at this point that the TLM's instruction shift register 56 of FIG. 8B is 3 bits long and that the 3 bit instructions have been decoded by the TAP link decode logic 58 of FIG. 8B to uniquely select a different TAP domain connection arrangement between the ICs TDI and TDO pins. For example and as indicated in FIG. 9, shifting in the following 3 bit TLM instructions and updating them from the TLM to be input to the input and output linking circuitry will cause the following TAP domain connections to be formed.

As seen in arrangement 901, a "000" instruction shifted into and updated from the TLM instruction register 50 will cause the IC TAP domain 22 to be enabled and connected in series with the TLM 30 between the TDI and TDO IC pins.

As seen in arrangement 902, a "001" instruction shifted into and updated from the TLM instruction register 50 will cause the IC TAP domain 22 and the Core 1 TAP Domain 24$_1$ to be enabled and connected in series with the TLM 30 between the TDI and TDO IC pins.

As seen in arrangement 903, a "010" instruction shifted into and updated from the TLM instruction register 50 will cause the IC TAP domain 22 and the Core N TAP domain 24$_n$ to be enabled and connected in series with the TLM 30 between the TDI and TDO IC pins.

As seen in arrangement 904, a "011" instruction shifted into and updated from the TLM instruction register 50 will cause the IC TAP domain 22, the Core 1 TAP Domain 24$_1$, and the Core N Tap domain 24$_n$ to be enabled and connected in series with the TLM 30 between the TDI and TDO IC pins.

As seen in arrangement 905, a "100" instruction shifted into and updated from the TLM instruction register 50 will cause the Core 1 TAP Domain 24$_1$ to be enabled and connected in series with the TLM 30 between the TDI and TDO IC pins.

As seen in arrangement 906, a "101" instruction shifted into and updated from the TLM instruction register 50 will cause the Core 1 TAP Domain 24$_1$ and Core N TAP domain 24$_n$ to be enabled and connected in series with the TLM 30 between the TDI and TDO IC pins.

As seen in arrangement 907, a "110" instruction shifted into and updated from the TLM instruction register 50 will cause the Core N TAP Domain 24$_n$ to be enabled and connected in series with the TLM 30 between the TDI and TDO IC pins.

At power up of the IC, the TLM 3-bit instruction shall be initialized to "000" to allow the IC TAP domain arrangement 901 to be enabled and coupled between TDI and TDO. This complies with the IC power up requirement established in the IEEE 1149.1 standard. The process of powering up a multiple TAP domain IC to where only the IC TAP domain is enabled and selected between the IC's TDI and TDO pins is disclosed in application Ser. No. 08/918,872, filed Aug. 26, 1999, now U.S. Pat. No. 6,073,254. Following power up, an instruction scan operation can be performed to shift instruction data through the IC TAP domain and the serially connected TLM to load a new IC TAP domain instruction and to load a new 3 bit instruction into the TLM. If the power up IC TAP domain arrangement 901 is to remain in effect between TDI and TDO, the 3 bit "000" TLM instruction of FIG. 9 will be re-loaded into the TLM instruction register during the above mentioned instruction scan operation. However, if a new TAP domain arrangement is to desired between TDI and TDO, a different 3 bit TLM instruction will be loaded into the TLM instruction register during the above mentioned instruction register scan operation.

From the description given above, it is clear that a different TAP domain arrangement may be selected by the TLM's instruction register following each 1149.1 instruction scan operation, more specifically during the Update-IR state (FIG. 2) of each instruction scan operation. The TAP domain selection process of the present invention differs from the previous TAP domain selection process described in referenced pending patent application Ser. No. 09/277,504, filed Mar. 26, 1999, in the following way. The TAP domain selection process disclosed in application Ser. No. 09/277,504, filed Mar. 26, 1999, comprised the steps of: (1) performing an instruction scan to load a instruction (referred to as a code in application Ser. No. 09/277,504, filed Mar. 26, 1999) into a TLM resident instruction register (referred to as instruction augmentation bits in application Ser. No. 09/277,504, filed Mar. 26, 1999), then (2) performing a data scan operation to a TLM resident data register (referred to as a link update register in application Ser. No. 091277,504, filed Mar. 26, 1999), selected by the instruction, to input a new TAP domain arrangement. The TAP domain selection process disclosed in the present invention comprises only the single step of: (1) performing an instruction scan to load a new TAP domain arrangement instruction into the instruction register of the FIG. 8A TLM. Thus the improvement of the present invention is seen to be the reduction of the two step TAP domain selection process described in application Ser. No. 09/277,504, filed Mar. 26, 1999, to the single TAP domain selection process described herein.

The following briefly re-visits and summarizes the operation of the TLM and input and output linking circuitry to clarify the TAP domain arrangement switching illustrated in FIG. 9. As previously described in regard to FIG. 4, the TMS inputs of enabled TAP domains are coupled to the IC's TMS input pin (via the gating circuitry of FIG. 5), while the TMS inputs of disabled TAP domains are gated to a logic low (via the gating circuitry of FIG. 5). Also, enabled TAP domains are serially connected (via the multiplexers of FIGS. 6 and 7) to form the desired serial TAP domain connection between the IC's TDI and TDO pins, the connection including the TLM. All the control for enabling or disabling the TAP domain TMS inputs and for forming serial TAP domain connections between the IC's TDI and TDO pins comes from the TLM's TAP link control bus. The control output from the TAP link control bus changes state during the Update-IR state of the TAP state diagram of FIG. 2. So, all TAP domain connection arrangement changes take place during the Update-IR state. In referenced patent applications Ser. No. 08/918,872, filed Aug. 26, 1999, now U.S. Pat. No. 6,073,254 and application Ser. No. 09/277,504, filed Mar. 26, 1999, all TAP domain connection arrangement changes take place during the Update-DR state, since data scan operations are used to load a new TAP domain connection in the link update registers.

Figure 10:
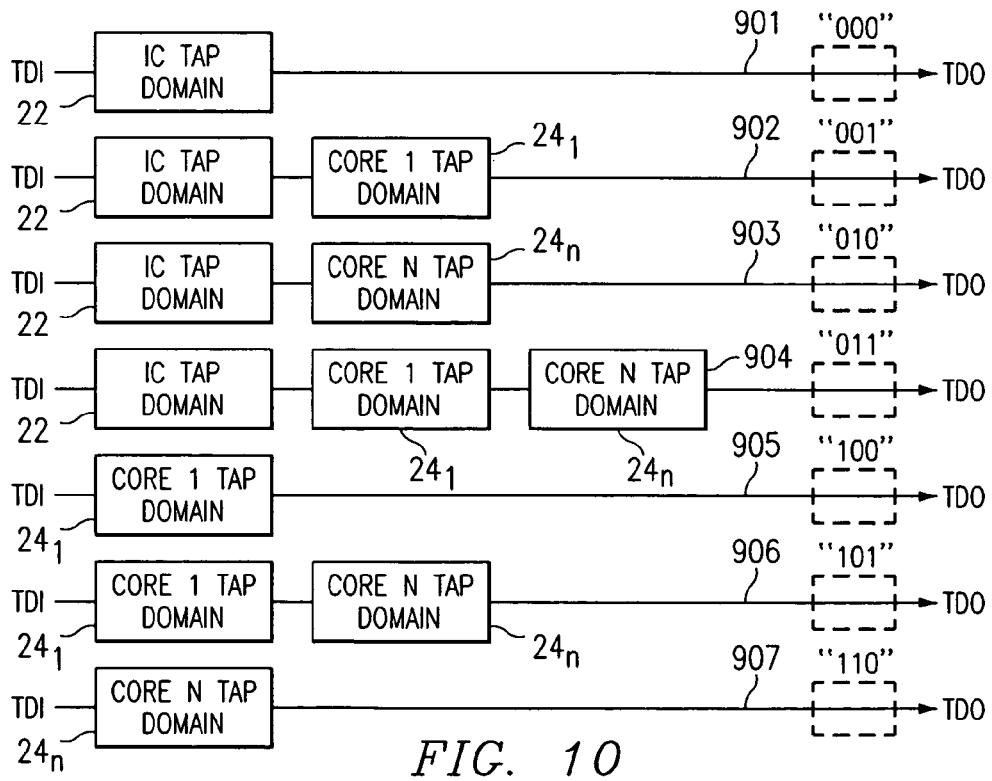
FIG. 10 illustrates that during 1149.1 data scan operations the TLM is configured, as described in regard to FIG. 8A, to simply form a connection path between the output of the selected TAP domain arrangement and the IC's TDO pin.

FIG. 10 is provided to illustrate that during 1149.1 data scan operations the TLM is configured, as described in regard to FIG. 8A, to simply form a connection path between the output of the selected TAP domain arrangement 901-907 and the IC's TDO pin. Thus the TLM does not add bits to 1149.1 data scan operations as it does for 1149.1 instruction scan operations. The forming of a connection path through the TLM during data scan operations is disclosed in the referenced pending patent application Ser. No. 09/277,504, filed Mar. 26, 1999.

It should be understood that while FIGS. 4-10 and accompanying descriptions have depicted the present invention as it would be applied and used to select TAP domains within an IC, the present invention can also be similarly applied and used to select TAP domains within individual IP core sub-circuits embedded within ICs as well. If applied and used within an IP core, the structure of the present invention remains the same. The only difference when using the FIG. 4 structure of the present invention in IP cores is that the TDI, TMS, TCK, and TRST input signals to the structure and the TDO output signal from the structure would be coupled to core terminals instead of IC pins.

What is claimed is:

1. An integrated circuit comprising:
   A. first TAP circuitry having a test data input, a test data output, a test clock input, and a test mode select input;
   B. second TAP circuitry having a test data input, a test data output, a test clock input, and a test mode select input;
   C. input linking circuitry selectively coupling test data input signals and test mode select signals to the first and second TAP circuitry in response to linking control signal inputs;
   D. output linking circuitry selectively coupling test data output signals from the first and second TAP circuitry in response to linking control signal inputs; and
   E. TAP linking module circuitry coupled in series with the test data inputs and test data outputs of the first and second TAP circuitry and having linking control signal outputs connected to the linking control signal inputs of the input linking circuitry and the output linking circuitry.

2. The integrated circuit of claim 1 in which the TAP linking module circuitry is free of any connection of control signals from the first and second TAP circuitry.

3. The integrated circuit of claim 1 in which the first and second TAP circuitry each include:
   i. a TAP controller connected to the test clock input and the test mode select input and having control outputs;
   ii. an instruction register coupled to the test data input, the test data output, and the control outputs, and having instruction outputs;
   iii. a data register coupled to the test data input, the test data output, and the instruction outputs; and
   iv. multiplexer circuitry coupling the test data output to the instruction register and to the data register.

4. The integrated circuit of claim 1 in which the first TAP circuitry includes boundary scan circuitry.

5. The integrated circuit of claim 1 in which the input linking circuitry includes gating circuitry selectively coupling the test mode select signals to the first and second TAP circuitry in response to the linking control signal inputs.

6. The integrated circuit of claim 1 in which the input linking circuitry includes multiplexing circuitry selectively coupling the test data input signals to the first and second TAP circuitry and selectively coupling the test data output signal from the second TAP circuitry to the first TAP circuitry in response to the linking control signal inputs.

7. The integrated circuit of claim 1 in which the output linking circuitry includes multiplexing circuitry selectively coupling the test data outputs of the first and second TAP circuitry to the TAP linking module circuitry in response to linking control signal inputs.

8. An integrated circuit comprising:
   A. first TAP circuitry having a test data input, a test data output, a test clock input, and a test mode select input, the first TAP circuitry including:
      i. a TAP controller connected to the test clock input and the test mode select input and having control outputs;
      ii. an instruction register coupled to the test data input, the test data output, and the control outputs, and having instruction outputs;
      iii. a data register coupled to the test data input, the test data output, and the instruction outputs; and
      iv. multiplexer circuitry coupling the test data output to the instruction register and to the data register;
   B. second TAP circuitry having a test data input, a test data output, a test clock input, and a test mode select input, the second TAP circuitry including:
      i. a TAP controller connected to the test clock input and the test mode select input and having control outputs;
      ii. an instruction register coupled to the test data input, the test data output, and the control outputs, and having instruction outputs;
      iii. a data register coupled to the test data input, the test data output, and the instruction outputs; and
      iv. multiplexer circuitry coupling the test data output to the instruction register and to the data register;
   C. input linking circuitry including multiplexing circuitry selectively coupling test data input signals to the first and second TAP circuitry and selectively coupling the test data output signal from the second TAP circuitry to the first TAP circuitry in response to linking control signal inputs, the input linking circuitry including gating circuitry selectively coupling test mode select signals to the first and second TAP circuitry in response to the linking control signal inputs;
   D. output linking circuitry including multiplexing circuitry selectively coupling the test data outputs of the first and second TAP circuitry to a test data output lead in response to the linking control signal inputs; and
   E. TAP linking module circuitry coupled in series with the test data inputs and outputs of the first and second TAP circuitry and having linking control signal outputs connected to the linking control signal inputs of the input linking circuitry and the output linking circuitry, the TAP linking module circuitry being free of any connection of control signals from the first and second TAP circuitry.

* * * * *